United States Patent
Narita

[11] 3,991,628
[45] Nov. 16, 1976

[54] LEVEL METER FOR SOUND SIGNALS

[75] Inventor: Shizuo Narita, Tokyo, Japan

[73] Assignee: Kabushiki Kaisha Nihon Keiki Seisakusho, Tokyo, Japan

[22] Filed: June 3, 1974

[21] Appl. No.: 475,436

[30] Foreign Application Priority Data
June 5, 1973 Japan............................ 48-65825[U]
Nov. 15, 1973 Japan............................... 48-127736

[52] U.S. Cl. ................................................. 73/557
[51] Int. Cl.² ........................................ G01H 3/14
[58] Field of Search ............ 73/557, 556, 555, 558, 73/552, 69, 70, 67; 179/1 R, 1 N; 360/31; 340/261

[56] References Cited
UNITED STATES PATENTS 3,200,899  8/1965  Krauss .................... 73/557
3,615,162  10/1971  Barber .................... 73/557
3,848,471  11/1974  Hamburg et al. ............ 73/557

FOREIGN PATENTS OR APPLICATIONS
515,160  5/1939  United Kingdom ............... 73/558

OTHER PUBLICATIONS
Frye, *Radio–Electronics,* "The VU Meter and its Uses," Nov., 1955, pp. 77–80.

*Primary Examiner*—Jerry W. Myracle
*Assistant Examiner*—Stephen A. Kreitman
*Attorney, Agent, or Firm*—Spensley, Horn & Lubitz

[57] ABSTRACT

A level meter for sound signals capable of indicating a mean value of the input level by deflection of a pointer while indicating a peak value of the input level when it has exceeded a predetermined value by lighting one of a plurality of light indication elements provided on the scale which corresponds to the predetermined value.

6 Claims, 13 Drawing Figures

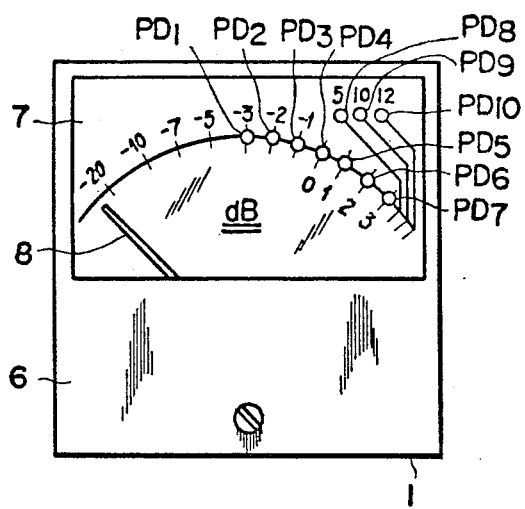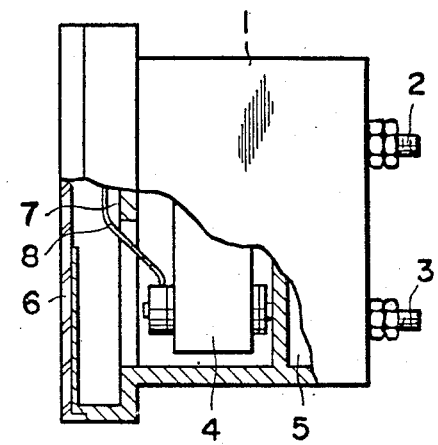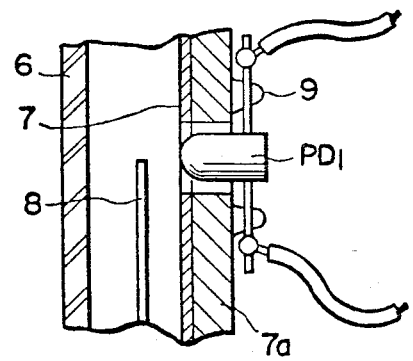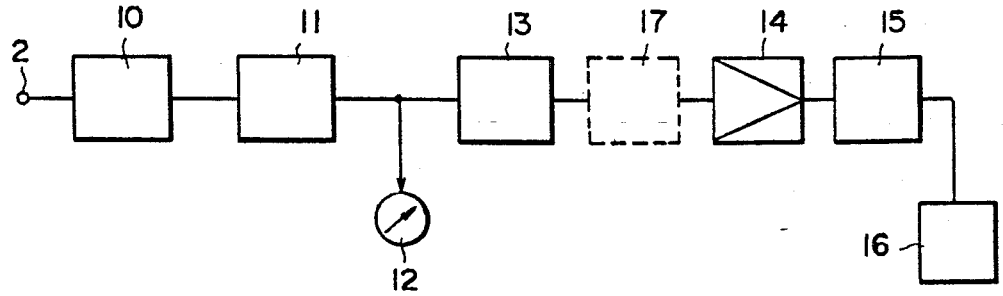

LEVEL METER FOR SOUND SIGNALS

BACKGROUND OF THE INVENTION

This invention relates to a level meter capable of indicating a mean value of a sound signal by means of a pointer while indicating a peak value of the signal on the scale and, more particularly, to a level meter of the above type adapted for use in sound recording.

In recording of sound on a tape recorder or the like instrument, the level of a signal is usually measured by means of a VU meter and adjusted so as not to saturate. The VU meter indicates only a mean value of a signal so that it has a disadvantage that the recording level tends to be too low in case of recording sounds of organ, whereas the peak value portion in case of recording sounds of a percussion instrument tends to exceed a saturation point thereby producing distortion.

SUMMARY OF THE INVENTION

It is, therefore, an object of the present invention to provide a level meter having functions of both of a VU meter and a peak meter thereby being capable of indicating both a mean value and a peak value of a sound signal.

It is another object of the invention to provide a level meter capable of accurately detecting a very small input in the order of −20 dB with an improved linearity of the relation between the angle of deflection of the pointer and the input signal level dB.

It is still another object of the invention to provide a level meter capable of promptly and accuratley detecting the quality of a sound signal and thereby effecting proper recording, reproduction and amplification.

These and other objects and features of the invention will now be described in conjunction with the accompanying drawings.

BRIEF DESCRIPTION OF THE DRAWINGS

FIG. 1 is a front elevationl view of one preferred embodiment of the level meter according to the invention;

FIG. 2 is a side elevational view, partly in section, of the embodiment shown in FIG. 1;

FIG. 3 is an enlarged fragmentary sectional view of the same embodiment illustrative of a manner of mounting light emitting diodes to the meter;

FIG. 4 is a block diagram showing one example of electrical construction of the level meter according to the invention;

DETAILED DESCRIPTION OF THE INVENTION

Figure 5:
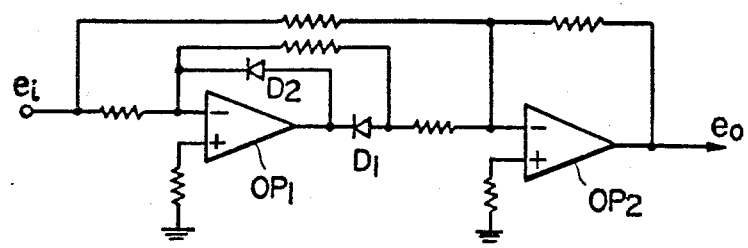
FIG. 5 is a circuit diagram showing one example of construction of a full-wave rectification circuit shown by a block 11 in FIG. 4.

Referring first to FIGS. 1 and 2, a casing 1 of the level meter is provided with a pair of signal input terminals 2 and a power supply terminal 3. The casing 1 accommodates a meter body 4 of a moving-coil type and also is provided with a chamber within which electric circuits including a circuit for detecting the peak value of a signal voltage applied to the terminals 2 are accommodated. A transparent cover 6 is mounted on the front portion of the casing 1 and a scale surface 7 is provided interiorly of the cover 6. A pointer 8 swingably mounted on the body 4 is adapted to move within a space defined by the cover 6 and the scale surface 7. A plurality of light emitting diodes $PD_1, PD_2 \ldots PD_n$ are disposed on the scale surface 7 in such a manner that each one of the diodes is located at one of the graduations within a desired range on the scale. FIG. 3 is a vertical enlarged section illustrative of a manner of mounting of the light emitting diodes on the scale surface 7. The diode $PD_1$ is bonded to the rear surface of a scale base $7a$. The diodes $PD_1 - PD_n$ are mounted to the scale base $7a$ so that the light emitting portions thereof will be observed from outside of the transparent cover 6. On the scale surface, these light emitting diodes $PD_1, PD_2 \ldots PD_n$ are respectively connected to their corresponding graduation positions by means of marking lines.

Figure 6:
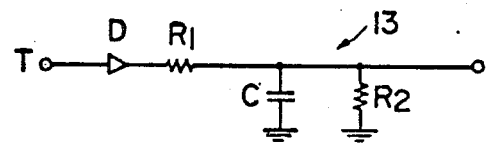
FIG. 6 is a circuit diagram showing one example of construction of a peak value detection circuit shown by a block 13 in FIG. 4.

FIG. 4 is an electrical block diagram showing one embodiment of the level meter made according to the invention. An input signal (sound signal) applied to the terminal 2 is fed to an impedance conversion circuit 10. This impedance conversion circuit 10 consisting, for example, of a transformer or an emitter-follower, circuit is provided for increasing input impedance and thereby preventing adverse effects to the measured circuit. The signal thereafter is supplied to a full-wave rectification circuit 11 where it is full-wave rectified. As the full-wave rectification circuit 11, an absolute value detection circuit as shown in FIG. 5 which comprises operational amplifiers $OP_1$ and $OP_2$ combined with diodes $D_1$ and $D_2$ may be employed. The full-wave rectified signal is applied to a movable coil 12 provided in the body 4 causing the pointer 8 to swing by an angle proportionate to a mean value of the applied signal. In the meanwhile, the signal is also applied to a peak value detection circuit 13. One example of the peak value detection circuit 13 is shown in FIG. 6. This illustrated circuit 13 comprising a diode D, resistors $R_1$ and $R_2$ and a capacitor C is adapted to cause the capacitor C to be charged with a time constant of $R_1 \times C$ upon receipt of the signal and to be discharged with a time constant of $r_2 \times C$.

The output of the peak value detection circuit 13 is amplified at a DC amplifier 14 and thereafter is applied to a level selection circuit 15. The level selection circuit 15 has a plurality of different preset levels and provides a signal when the level of the applied signal exceeds the preset levels to the light emitting elements of an indicator 16. One example of the level selection circuit 15 is shown in FIG. 7.

Figure 7:
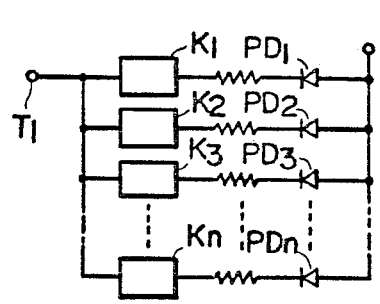
FIG. 7 is a circuit diagram showing one example of constructions of a level selection circuit 15 and an indication circuit 16 using light emitting diodes shown in FIG. 4.

In the level selection circuit 15 shown in FIG. 7, the output of the DC amplifier 14 is applied to all of level selectors $K_1 - K_n$ via a terminal $T_1$. The level selectors $K_1 - K_n$ are respectively provided with preset levels $V_1 - V_n$ and emit a signal when the applied signal exceeds the preset levels thereby lighting the light emitting diodes $PD_1 - PD_n$. If the input level rises to a value, for example between $V_2$ and $V_3$, the light emitting diodes $PD_1$ and $PD_2$ are lighted one by one.

Figure 8:
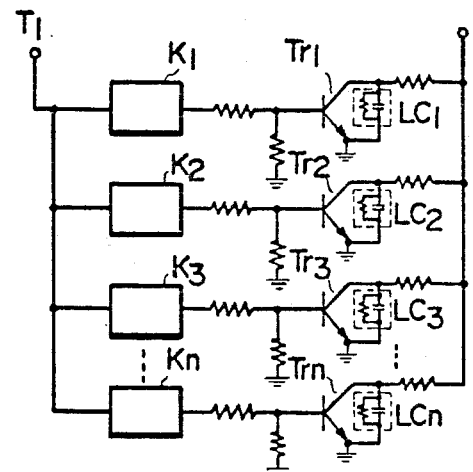
FIG. 8 is a circuit diagram similar to FIG. 7 showing an example in which liquid crystals are used as the light indication elements.

As the light emitting elements, any type of elements may be used if only they can be lighted upon application thereto of an electrical signal from the level selection circuit. FIG. 8 shows an example in which liquid crystals $LC_1 - LC_n$ are employed as the light emitting elements. In FIG. 8, reference characters $Tr_1 - Tr_n$ designate transistors.

Figure 9:
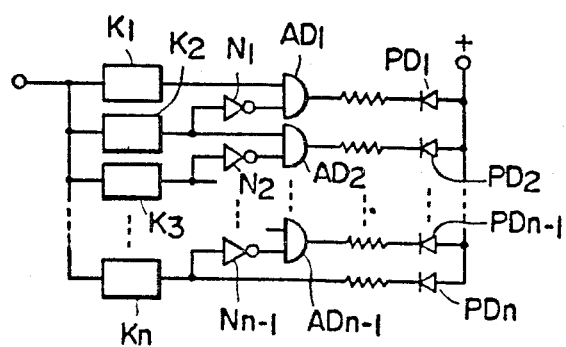
FIG. 9 is a circuit diagram similar to FIG. 7 showing an example in which the peak value of the input level is indicated in real time.

In the above described embodiment, all the light emitting elements corresponding to graduations below the level of the applied signal are lighted. An easier reading of the level meter will be made possible if a light emitting element corresponding to the maximum value of the input level only is lighted in real time. An embodiment realizing this purpose is shown in FIG. 9. In FIG. 9, reference characters $N_1 - N_{n-1}$ designate NOT circuits and $AD_1 - AD_{n-1}$ AND circuits respectively. When the input level is between $V_1$ and $V_2$, the light emitting diode $PD_1$ is lighted. As the input level increases to a value between $V_2$ and $V_3$, the AND circuit $AD_1$ ceases to gate out a signal which lights the diode $PD_1$ and, accordingly, the diode $PD_1$ goes out. On the other hand, the AND circuit $AD_2$ gates out a signal to light the diode $PD_2$.

Figure 12:
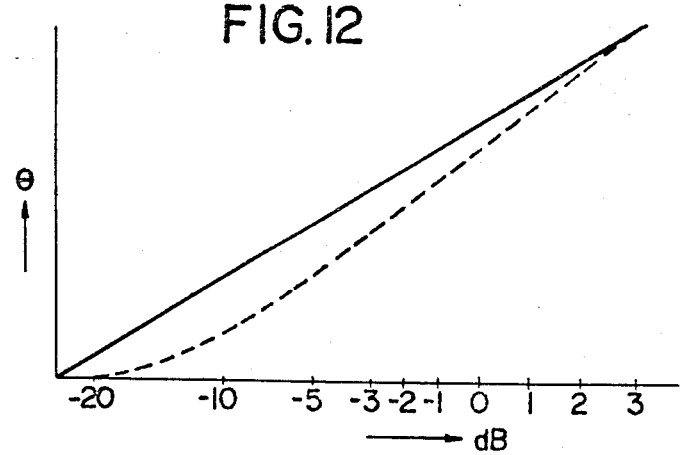
FIG. 12 is a graphical diagram showing relationship between deflection of the pointer and the input level dB of the level meter according to the invention in comparison with that of a prior art level meter.

In the above-described device, any sound signal applied to the terminal 2 is full-wave rectified in the full-wave rectification circuit 11 consisting of the absolute value detecting circuit and thereafter is applied to the movable coil of the istrument body 4. As stated above, the detecting circuit 11 comprising an operational amplifier and diodes for rectification incorporated therein decreases, through its negative feed-back, the distortion due to non-linear characteristic of the diode and produces a d.c. output of a mean value accurately proportional to the input level. It will be understood that if the coil of the instrument body 4 is connected only through the rectifier to the input terminal 2 as in the prior art, a small input in the order of −20dB can hardly be detected as will be apparent from the dot line in FIG. 12 which plots relationship between the angle of deflection $\theta$ of the pointer and the input signal level dB. If the above-mentioned detector circuit 11 is used, such low input level can be precisely measured by the deflection of the pointer 8 as shown in the solid line in FIG. 12. Since the indication of the pointer 8 corresponds to the mean value of the inputs, an indication as a VU meter is obtained by providing a decibel scale on the scale surface 7.

Figure 11:
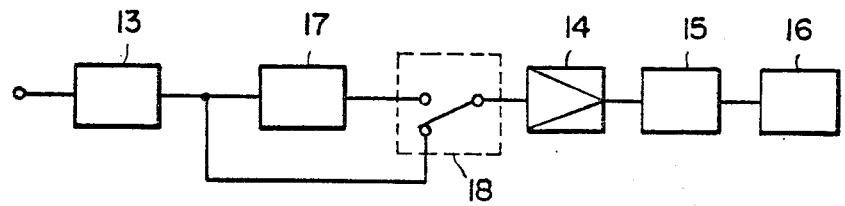
FIG. 11 is an electrical block diagram showing another embodiment of the level meter according to the invention capable of indicating the highest level of the input signal encountered during measuring as well as indicating the peak value in real time.

FIG. 11 is a block diagram showing another embodiment of the invention in which not only the instantaneous peak value of the sound signal is indicated in real time by means of the light emitting elements provided on the scale but the highest level of the applied signal can be stored and indicated. In the figure, the construction of the circuit stages before a peak value detection circuit 13 is the same as the one shown in FIG. 4.

In the previously described embodiment, the peak value of the input level is indicated in real time. An adequate recording can actually be made, however, by watching only the highest value of the input level. Accordingly, a circuit for holding this highest level is inserted as shown by a broken line between the peak value detection circuit 13 and the DC amplifier 14 thereby enabling a permanent indication of the highest value of the input level.

Figure 10:
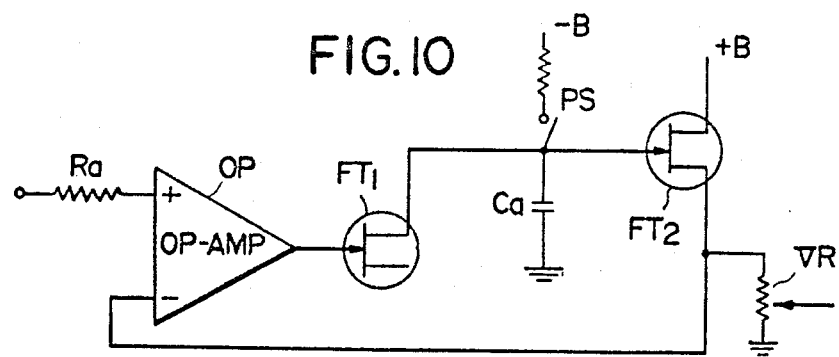
FIG. 10 is a circuit diagram showing one example of a highest level storing circuit 17 shown in FIG. 4.

A highest level storing circuit 17 is of a construction such as shown in FIG. 10. A signal from the peak value detecting circuit 13 is applied to a positive terminal of an operational amplifier OP via a resistor Ra. The output of the amplifier OP in turn is applied to a capacitor Ca through an FET $FT_1$ for charging this capacitor Ca. Accordingly the charged voltage of the capacitor Ca always corresponds to the highest level of the input signal. The capacitor Ca is connected at one terminal thereof to the gate of an FET $FT_2$. The drain of the FET $FT_2$ is grounded through a variable resistor VR. Accordingly, a voltage corresponding to the highest level can be obtained from the sliding terminal of the variable resistor VR by adjusting the sliding terminal as desired. The output of the highest level storing circuit 11 is supplied to the indicator 16 through the DC amplifier 14 and the level circuit 15 to light the light emitting elements.

Referring further to FIG. 11, the output of the highest storing circuit 17 and the output of the peak value detection circuit 13 are applied to the DC amplifier 14 through a digital switch 18. The digital switch 18 which is adapted to be switched at a predetermined frequency functions to apply both of the outputs to the DC amplifier 14 thereby enabling the meter to indicate the peak values in real time as well as indicate the highest value. The highest level held in the highest level storing circuit 17 can be reset by closing a reset switch RS shown FIG. 10.

The provision of the highest level storing circuit facilitates the supervision of recording. Particularly, the highest level of the input signal can be known without requiring permanent watching of the meter so that level setting in case of printing (dabbing), track-down and other operations on a recording tape is greatly facilitated.

Figure 13:
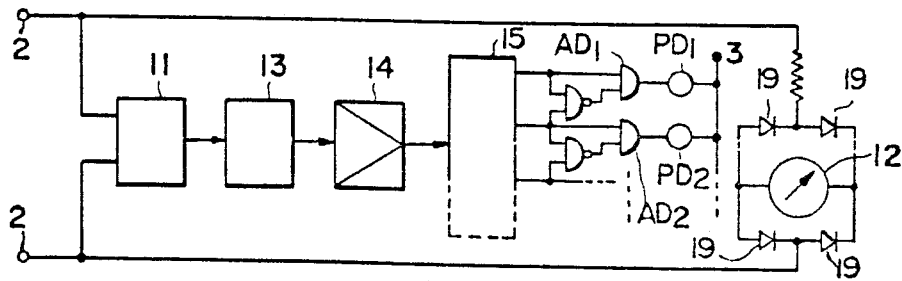
FIG. 13 is an electrical block diagram showing still another embodiment of the level meter according to the invention.

In each of the above described embodiments, the fullwave rectification circuit is commonly utilized for indication of the peak value and that of the mean value. The full-wave rectification circuits may be provided separately for the respective purposes. FIG. 13 shows one example in which the full-wave rectification circuits are separately provided. In FIG. 13 a full-wave rectification circuit comprises four diodes 19 and the output of this circuit is applied to the movable coil of the instrument body 4, whereas another fullwave rectification circuit 11 which receives its input from the terminal 2 is provided for the indication of the peak value. The construction of this example in other respects is the same as or similar to those of the previously described embodiments so that detailed description thereof will be omitted.

What is claimed is:

1. A level meter for sound signals comprising means for rectifying an input sound signal and applying said rectified input signal to a moving coil of a moving-coil type meter to indicate a substantially mean value of said input sound signal; a peak value detection circuit coupled to the input of said moving coil meter and to said means for rectifying said input sound signal for detecting a peak value of said rectified input signal; a level selection circuit for producing an output signal when the peak value of said input sound signal exceeds each of a plurality of predetermined levels, said level selection circuit coupled to said peak value detection circuit; and a plurality of light indication elements, each said light indicating element coupled to said level selection circuit with a predetermined light indication element corresponding to the output of said level selection circuit at a predetermined level and being actuated upon receipt of said output signal, each said light indication element disposed along a graduated scale, said graduated scale also being used by a pointer of said moving-coil type meter, whereby the mean value of the input signal is indicated on said scale by deflection of said pointer of said moving-coil type meter to a graduation corresponding to said mean value, and the peak value thereof is indicated on said scale by one of said light indication elements disposed at the graduation corresponding to said peak value.

2. A level meter as defined in claim 1 wherein said means for rectifying said input sound signal is an absolute value detection circuit comprising an operational amplifier and diodes.

3. A level meter as defined in claim 1 wherein said light indication elements are light emitting diodes.

4. A level meter as defined in claim 1 wherein said light indication elements are liquid crystals.

5. A level meter for sound signals comprising means for rectifying an input sound signal and applying said rectified input signal to a moving coil of a moving-coil type meter to indicate a substantially mean value of said input sound signal; a peak value detection circuit coupled to the input of said moving coil meter and to said means for rectifying said input sound signal for detecting a peak value of said rectified input signal; a level selection circuit for producing an output signal when the peak value of said input sound signal exceeds each of a plurality of predetermined levels, said level selection circuit coupled to said peak value detection circuit; and a plurality of light indication elements, each said light indicating element coupled to said level selection circuit with a predetermined light indication element corresponding to the output of said level selection circuit at a predetermined level and being actuated upon receipt of said output signal; each said light indication element disposed along a graduated scale, said graduated scale also being used by a pointer of said moving-coil type meter; a highest level storing circuit disposed between said peak value detection circuit and said level selection circuit and being capable of holding and storing the highest level of the input signal encountered during measuring, the highest level of the input signal being indicated by said light indication elements, whereby the mean value of the input signal is indicated by deflection of a pointer of said meter, and the peak value thereof is indicated by one of said light indication elements disposed at the graduation corresponding to said peak value.

6. A level meter as defined in claim 5 which further comprises a digital switch capable of switching the output of said highest level storing circuit and the output of said peak value detection circuit in time-sharing manner and supplying either one of said outputs to said level selection circuit, whereby the real time indication of the peak value and the indication of the highest level encountered during measuring are simultaneously effected.

* * * * *